US009412436B1

(12) United States Patent
Rahim et al.

(10) Patent No.: US 9,412,436 B1
(45) Date of Patent: *Aug. 9, 2016

(54) MEMORY ELEMENTS WITH SOFT ERROR UPSET IMMUNITY

(71) Applicant: Altera Corporation, San Jose, CA (US)

(72) Inventors: Irfan Rahim, Milpitas, CA (US); Andy L. Lee, San Jose, CA (US); Jeffrey T. Watt, Palo Alto, CA (US); William Bradley Vest, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/247,075

(22) Filed: Apr. 7, 2014

Related U.S. Application Data

(63) Continuation of application No. 12/568,638, filed on Sep. 28, 2009, now Pat. No. 8,797,790.

(60) Provisional application No. 61/102,000, filed on Oct. 1, 2008, provisional application No. 61/120,334, filed on Dec. 5, 2008.

(51) Int. Cl.
  *G11C 11/00* (2006.01)
  *G11C 11/412* (2006.01)
  *G11C 5/06* (2006.01)

(52) U.S. Cl.
  CPC .............. *G11C 11/412* (2013.01); *G11C 5/06* (2013.01)

(58) Field of Classification Search
  None
  See application file for complete search history.

(56) References Cited

U.S. PATENT DOCUMENTS

| 4,805,148 | A | 2/1989 | Diehl-Nagle et al. |
| 5,111,429 | A | 5/1992 | Whitaker |
| 5,157,625 | A | 10/1992 | Barry |
| 5,245,228 | A | 9/1993 | Harter |
| 5,570,313 | A | 10/1996 | Masson et al. |
| 6,573,773 | B2 | 6/2003 | Maki et al. |
| 6,775,178 | B2 | 8/2004 | Liu et al. |
| 7,139,190 | B1 | 11/2006 | de Jong |
| 7,233,518 | B2 | 6/2007 | Liu |
| 7,332,780 | B2 * | 2/2008 | Matsuda et al. ............. 257/369 |
| 7,352,610 | B1 | 4/2008 | Pedersen et al. |
| 7,515,452 | B1 | 4/2009 | de Jong et al. |
| 7,529,118 | B2 * | 5/2009 | Burleson et al. ............ 365/156 |
| 8,797,790 | B1 * | 8/2014 | Rahim et al. ................ 365/156 |
| 2005/0259462 | A1 | 11/2005 | Wood |
| 2007/0013425 | A1 * | 1/2007 | Burr et al. .................... 327/208 |

* cited by examiner

*Primary Examiner* — Kretelia Graham
(74) *Attorney, Agent, or Firm* — Treyz Law Group; Vineet Dixit; Jason Tsai

(57) ABSTRACT

Memory elements are provided that exhibit immunity to soft error upset events when subjected to radiation strikes such as high-energy atomic particle strikes. Each memory element may each have four inverter-like transistor pairs that form a bistable element, a pair of address transistors, and a pair of relatively weak transistors connected between two of the inverters that create a common output node which is resistant to rapid changes to its state. The transistors may be connected in a pattern that forms a bistable memory element that is resistant to soft error upset events due to radiation strikes. Data may be loaded into and read out of the memory element using the address transistor pair.

11 Claims, 13 Drawing Sheets

MEMORY ELEMENTS WITH SOFT ERROR UPSET IMMUNITY

This application is a continuation of U.S. patent application Ser. No. 12/568,638, filed Sep. 28, 2009, which claims the benefit of U.S. provisional patent application No. 61/102,000, filed Oct. 1, 2008 and U.S. provisional patent application No. 61/120,334, filed Dec. 5, 2008. This application claims the benefit of and claims priority to U.S. patent application Ser. No. 12/568,638, filed Sep. 28, 2009, U.S. provisional patent application No. 61/102,000, filed Oct. 1, 2008, and U.S. provisional patent application No. 61/120,334, filed Dec. 5, 2008, which are hereby incorporated by reference herein in their entireties.

BACKGROUND

This invention relates to memory elements, and more particularly, to memory elements that demonstrate soft error upset immunity for integrated circuits such as programmable logic devices.

Integrated circuits often contain memory elements. Typical memory elements are based on cross-coupled inverters (latches). A memory element retains data only so long as the integrated circuit is powered. In the event of power loss, the data in the memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

It would therefore be desirable to be able to improve the soft error upset performance of memory elements in integrated circuits such as programmable logic device integrated circuits.

SUMMARY

Integrated circuits with static random-access memory cells are provided. The integrated circuits may be programmable integrated circuits, memory chips, or other suitable integrated circuits. The memory cells may be used as static random-access memory (SRAM) or, in programmable integrated circuits, the memory cells may be used as configuration random-access memory (CRAM). When used as CRAM cells, static output signals from the memory elements may be applied to the gates of programmable logic transistors to configure the transistors to perform desired logic functions.

Each memory cell may be formed from four inverter-like transistor pairs that are interconnected with each other. Each transistor pair may form an inverter-like circuit having a p-channel metal-oxide-semiconductor (PMOS) transistor connected in series with an n-channel metal-oxide-semiconductor (NMOS) transistor between a positive power supply terminal and ground. The four transistor pairs may be connected in a pattern that forms a bistable memory element. In this type of bistable memory element, the first and second inverters form a first latch and the third and fourth inverters form a second latch. A common output may be formed from the output of the second and fourth inverters that is configured to resist a rapid change in its state.

The first inverter has gate control lines that are connected to the output of the second inverter and the common output. The second inverter has gate control lines that are connected to the output of the first inverter and the output of the third inverter. The third inverter has gate control lines that are connected to the output of the fourth inverter and the common output. The fourth inverter has gate control lines that are connected to the output of the third inverter and the output of the fourth inverter.

The common output may be provided by a common output line that is between a pair of relatively weak transistors (e.g., transistors which have a large resistance even when turned on) connected in series between the outputs of the second and fourth inverters. With another suitable arrangement, the common output may be provided by a common output line that is between a pair of relatively high resistance resistors connected in series between the outputs of the second and fourth inverters. The common output line may have a capacitance that, in combination with the resistive connections to output lines of the second and fourth inverters, prevents disturbances on the output lines from rapidly propagating to the common output line. If desired, the resistors that are connected between the outputs of the second and fourth inverters can be replaced with other suitable circuit components. For example, an inverter may be provided that has an output connected to the common output line and an input connected to an input of the second or fourth inverter.

Memory cells may also be provided that have five or more inverter-type circuits. For example, memory cells may be provided that have five inverter-type circuits or six inverter-type circuits each of which receives a pair of logically equivalent logic input signals. Each inverter-type circuit may have a PMOS transistor whose gate forms a first input to the inverter-type circuit and a NMOS transistor whose gate forms a second input to the inverter-type circuit. The PMOS and NMOS transistors have gates, body terminals, sources, and drains. The sources and drains of the transistors (collectively source-drains) may be connected to internal data storage nodes in the memory cell. Interconnections are formed in the memory cell so that the outputs of the inverter-type circuits are distributed among various inverter-type circuit inputs to provide redundancy.

The redundancy provided by the distributed inputs and outputs of the inverter-type circuits helps make the memory cells resistant to soft error upset events due to radiation strikes (e.g., from high energy particles). Even if one storage node in a cell is disturbed, other nodes in the memory cell remain undisturbed, allowing the memory cell to recover and thereby retain its original state.

Each memory cell may have address transistors. There may be, for example, two or more address transistors associated with each memory cell. The address transistors may drive data into the storage nodes of the memory cell.

The address transistors may be controlled using address signals. For example, a pair of address transistors may be controlled using a pair of address signals on respective address lines (word lines). A single data line (bitline) may be connected to the cell through the pair of address transistors. During data writing operations, the address transistors may be controlled in parallel to load data into the memory cell. To improve write margin, the power supply voltage to the cell may be lowered temporarily during writing and/or the address signals may be overdriven. During data read operations, one of the address transistors may be used to read data from the memory cell and one of the address transistors may remain off to help prevent an undesired cell upset. During normal operation, both address transistors may be turned off and the output of the cell may be used to configure programmable logic.

Further features of the invention, its nature and various advantages will be more apparent from the accompanying drawings and the following detailed description of the preferred embodiments.

DETAILED DESCRIPTION

The present invention relates to integrated circuit memory elements that are resistant to soft error upset events and to methods for using such memory elements. The memory elements, which are sometimes referred to as cells, may contain any suitable number of transistors. With one suitable arrangement, each cell contains ten or more transistors.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
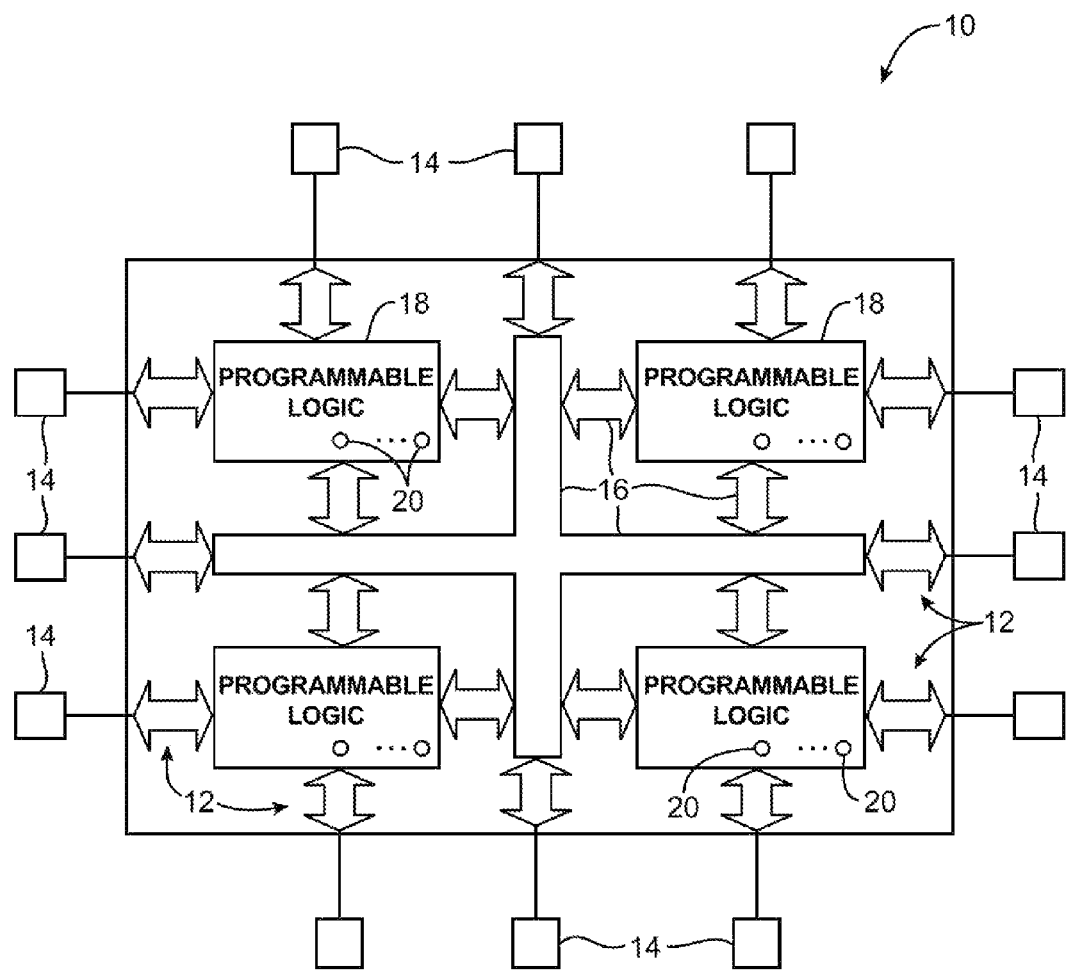
FIG. 1 is a diagram of an illustrative integrated circuit that may contain random-access memory cells in accordance with an embodiment of the present invention.

An illustrative integrated circuit such as a programmable logic device 10 in accordance with an embodiment of the present invention is shown in FIG. 1.

Device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 produce static control signals at their outputs that selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
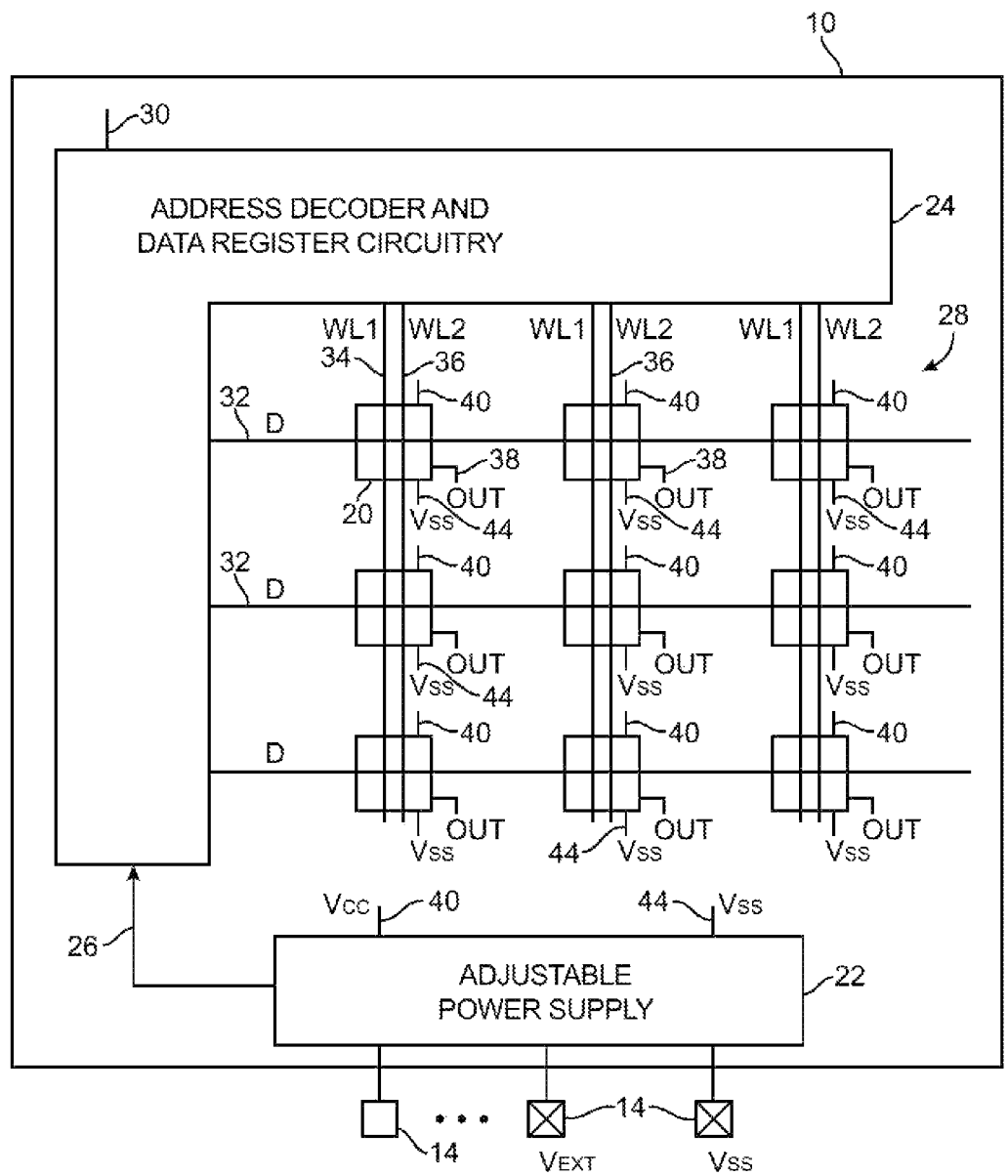
FIG. 2 is a diagram of an illustrative array of memory cells in accordance with an embodiment of the present invention.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2. As shown in FIG. 2, integrated circuit 10 may have power regulator circuitry 22. Power regulator circuitry 22 may receive external voltages via pins 14. For example, power regulator circuitry may receive one or more positive power supply voltages such as Vext and a ground voltage Vss (e.g., 0 volts). Examples of positive power supply voltages that may be received include a 0.9 volt positive power supply voltage, a 1.2 volt positive power supply voltage, a 1.5 volt positive power supply voltage, a 2.5 volt positive power supply voltage, etc.

Adjustable power supply circuit 22 may produce internal power supply voltages on its outputs. These power supply voltages may include one or more positive power supply voltages (e.g., 0.9 volts, 1.0 volts, 1.2 volts, 1.5 volts, etc.) supplied on one or more respective power supply paths such as path 40 and a ground power supply voltage Vss (e.g., 0 volts) supplied on a ground path such as path 44. One or more of these voltages may be provided to address decoder and data register circuitry 24 via paths such as path 26. Adjustable power supply circuit 22 may produce elevated power supply voltages such as one or more overdrive voltages. Device 10 may utilize overdrive voltages during certain operations such as memory element writing operations when elevated address signal strengths may help improve write margin.

Circuitry 24 may be used to read and write data from memory cell array 28. When array 28 is being used as regular SRAM, data write operations may be performed when it is desired to store processing results and data read operations may be performed when it is desired to retrieve stored data. When array 28 is being used as CRAM, data write operations may be performed to load configuration data and data read operations may be performed to confirm that configuration data loading operations have been performed successfully. During normal operation, when CRAM cells are neither being written to or read from, the static output of each CRAM cell can be used to control a respective programmable logic component such as a transistor.

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Lines such as lines 32, 34, 36, 38, 40, and 44 may be used to distribute signals in array 28. For example, path 40 may be used to convey power supply signals such as a positive power supply signal Vcc, reduced power supply signals, and elevated power supply signals from supply 22 to cells 20 and path 44 may be used to convey ground power supply signals such as a ground power supply signal Vss (e.g., 0 volts) from supply 22 to cells 20. In an array of cells 20 that is being used as configuration memory, output signals OUT for controlling programmable logic components can be provided on output lines 38.

Lines such as lines 32 may be used to load data D into cells 20 and may be used to read data out from cells 20. Lines 32 may sometimes be referred to as data lines or bitlines. If desired, each line 32 may have a first data line that carries a data signal and a second complimentary data line that carries the logical inverse of that data signal (e.g., lines 32 may be differential data lines or differential bitlines). Lines 34 and 36 may be used to convey address signals and are sometimes referred to as address lines or word lines.

During data write operations, write drivers in circuitry 24 may drive data onto lines 32. During read operations, lines 32 may be used to convey data from addressed cells 20 in array 28 to sense amplifiers in circuitry 24. The sense amplifiers may use a differential sensing scheme. With this type of scheme, a sense amplifier may compare the signal on a given data line to a reference data line. In preparation for the data read operation, data lines may be precharged to a known value (e.g., a voltage of 1.5 volts). When a sufficient voltage drop is detected on the given data line relative to the reference data line by the sense amplifier during a read, circuitry 24 can conclude that the cell from which data is being read contains a logic zero. When no voltage drop is detected, circuitry 24 can conclude that the cell from which data is being read contains a logic one.

Address signals WL1 and WL2 may be used to address cells 20 in array 28 during reading and writing. With one suitable arrangement, signals WL1 and WL2 may both be asserted (e.g., taken high) during data write operations and only one of these signals (e.g., WL1) may be asserted during data read operations. If desired, device 10 may only have a single address line such as address line 34, so that only signal WL1 would be asserted during data writing operations and during data read operations.

Power regulator circuitry 22 may generate static or time-varying power supply signals on one or more power supply outputs such as positive power supply path 40 and ground power supply path 44. For example, power regulator circuitry 22 may generate a time-varying positive power supply voltage on path 40. Power regulator circuitry 22 may, for example, temporarily lower Vcc from 1.5 volts to 1.2 volts during write operations to weaken cells 20. Lowering Vcc during data loading facilitates data writing and helps to increase write margin. With one suitable arrangement, power regulator circuitry 22 may temporarily generate an overdrive voltage (e.g., by raising one or more positive power supply voltages from Vcc) that can be applied to data lines 32, address lines 34 and 36, and/or power supply terminals of address transistors of memory cells 20. Raising Vcc for data lines 32, address lines 34 and 36, and/or power supply terminals of address transistors can facilitate data writing and help to increase the write margins of cells 20.

Address decoder and data register circuitry 24 may use the power supply signals on path 26 or other suitable power sources to generate fixed signals or signals with time-varying magnitudes.

Circuitry 24 may control data loading operations for array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address signals are labeled WL1 and WL2 in FIG. 2. Signals WL1 and WL2 may be controlled independently during reading and writing and are typically controlled independently in each column.

Configuration data may be loaded into registers in circuitry 24 in series. These registers may then apply the configuration data (signals D) to array 28 over lines 32 (or over true and complementary data lines D and ND in differential data schemes). Address decoder circuitry in circuitry 24 may receive addressing information via input 30. The address decoder circuitry can then systematically assert desired address lines 34 and 36. As the address lines WL1 and WL2 in a given column are taken high, the data on the data lines 32 is loaded into the memory elements 20 in that column. By addressing each column in this way, the entire array 28 may be loaded with configuration data.

After the array has been loaded, address signals WL1 and WL2 may be deasserted and the output 38 of each memory element 20 may produce a corresponding static control signal OUT for controlling the gate of a pass transistor or other logic component in the programmable logic 18 of the programmable logic device 10 (FIG. 1).

Data reading operations for array 28 may be performed by systematically asserting desired address lines WL1 while maintaining address lines WL2 low. During read operations, the resulting data on data lines 32 is monitored (e.g., using sense amplifier circuitry in circuitry 24).

Figure 3A:
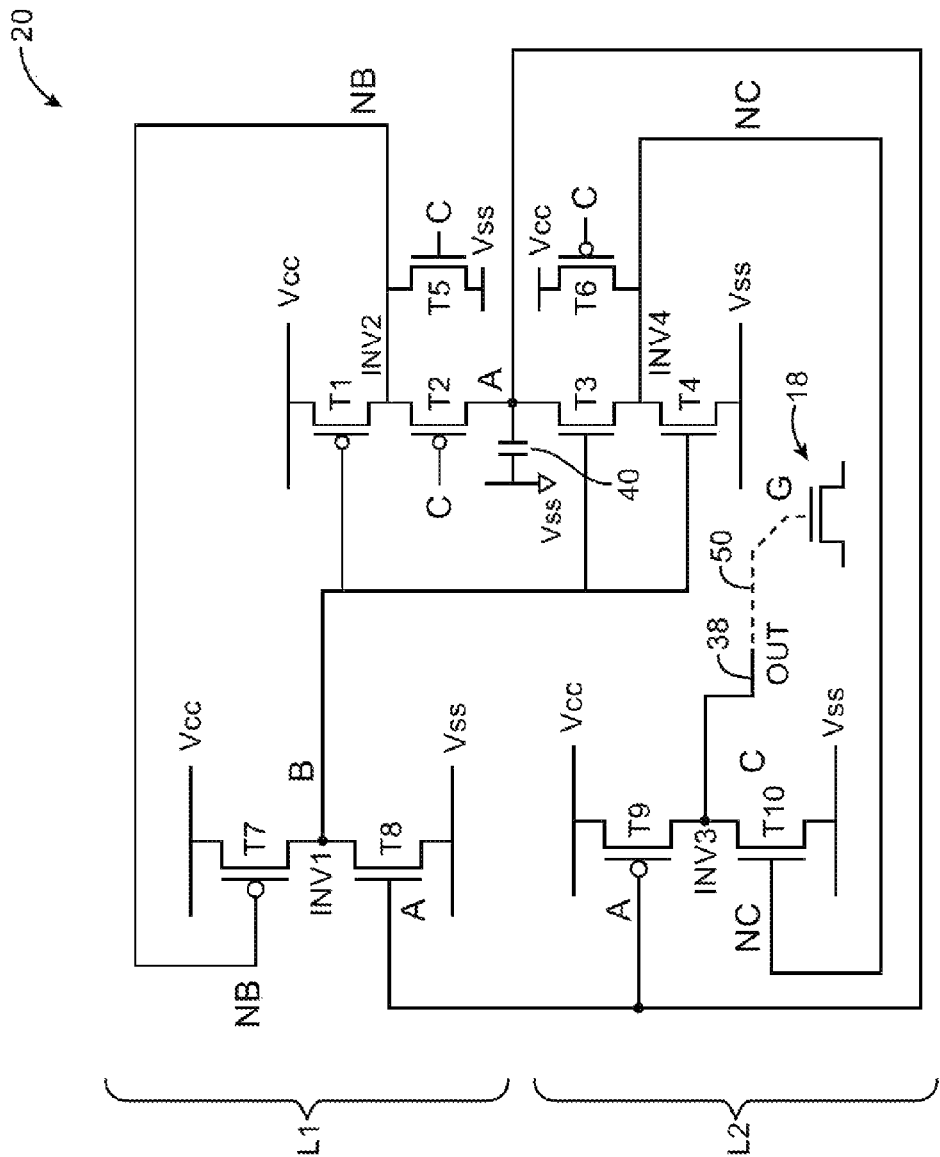
FIG. 3A is a diagram of an illustrative memory cell in accordance with an embodiment of the present invention.

A memory element 20 of the type that may be used in array 28 of FIG. 2 is shown in FIG. 3A. As shown in FIG. 3A, memory element 20 may have p-channel metal-oxide-semiconductor (PMOS) transistors T1, T2, T6, T7, and T9 and n-channel metal-oxide-semiconductor (NMOS) transistors T3, T4, T5, T8, and T10. Memory element 20 may also have NMOS and PMOS address transistors (not shown in FIG. 3A). Each transistor in memory element 20 may have a source S, a drain D, a body B, and a gate G. The sources and drains of the transistors are sometimes collectively referred to as source-drain terminals.

Unlike conventional memory element designs that are based on a pair of cross-coupled inverters, memory element 20 of FIG. 3A has four inverter-like pairs of transistors that are interconnected (first pair T7/18, second pair T1/T5, third pair T9/T10, and fourth pair T6/14). The first inverter INV1 (T7/18) and the second inverter INV2 (T1/T5) form a first latch L1 and the third inverter INV3 (T9/T10) and the fourth inverter INV4 (T6/14) form a second latch L2.

In conventional memory cells formed from a pair of cross-coupled inverters, there is a relatively strong likelihood that a radiation strike on an inverter's input node will cause the inverter's output to change states, thereby flipping the state of the cell to an erroneous value. In the arrangement of FIG. 3A, the gate of the first transistor in each transistor pair receives its input from a different source than the gate of the second transistor in the same transistor pair. In addition, the gates of one of the transistors in the first pair of transistors and one of the transistors in the third pair of transistors receive their input from a common source (node A) that can be configured to resist a rapid change in its state. Because the control signals for the gates of the transistors are distributed, memory cell 20 is better able to recover from a radiation strike on a particular node without flipping its state than conventional memory elements based on cross-coupled inverters.

There are five labeled nodes in memory element 20 of FIG. 3A: A, B, NB, C, and NC. NB and NC are complementary to nodes B and C, respectively. Any of these nodes may be used as output 38 of FIG. 2. For example, node B may be connected to output 38 of FIG. 2 as shown in FIG. 3A. Output signal OUT on line 38 may be used as a static control signal to control programmable logic (e.g., by being applied to the gate G of a programmable logic metal-oxide-semiconductor transistor 18 by path 50 as shown in FIG. 3A).

Memory element 20 exhibits bistable operation. When memory element 20 has been loaded with a "1," the values of A, B, NB, C, and NC will be "0," "1," "0," "1," and "0," respectively. When memory element 20 has been loaded with a "0," the values of A, B, NB, C, and NC will be "1," "0," "1," "0," and "1," respectively.

Transistors T2 and T3 can couple together the outputs of inverters INV2 and INV4. When memory element 20 has been loaded with a "1" and B is "1," transistor T3 will be turned on and node A will be coupled to node NC. When memory element 20 has been loaded with a "0" and C is "0," transistor T2 will be turned on and node A will be coupled to node NB. Because nodes NB and NC are logically equivalent (e.g., they are either both "1" or are both "0" during normal operation), node A will be at the same value as nodes NB and NC whenever element 20 is in one of its two stable states.

With one suitable arrangement, transistors T2 and T3 can be relatively weak transistors. For example, transistors T2 and T3 may have a relatively large resistance even when fully turned on (when compared to other transistors in memory element 20). In addition, node A may have an associated capacitance. For example, node A may have a parasitic capacitance as shown schematically by capacitance 40. The capacitance associated with node A and the resistance of transistors T2 and T3 create an RC circuit that can isolate node A from rapid changes in nodes NB and NC. With this type of configuration, changes to node NB and NC will not propagate to node A rapidly.

The capacitance of node A and the resistance of transistors T2 and T3 may be configured so that the time required for node A to respond to a disturbance on node NB or node NC (e.g., which may be cause by a radiation strike) is greater than the time required for memory cell 20 to recover from the disturbance (e.g., by discharging or recharging nodes affected by the disturbance through power supply lines). As one example, cell 20 may require approximately 100 picoseconds to recover from a radiation strike. With this type of arrangement, memory cell 20 may be configured to retain its state as long as the disturbance is below a certain threshold (e.g., cell 20 may be made more or less resistant to radiation strikes to ensure that a radiation strike that is below a threshold level of energy does not disturb the state of cell 20). Because the control signals for the gates of the transistors T8 and T9 originate from node A, which is slow to respond to disturbances on other portions of cell 20 (e.g., slower than 100 ps), memory cell 20 is better able to recover from a radiation strike that affects node NB or NC than a conventional memory element.

Consider, as an example, the situation in which node A, node NB, and node NC are high ("1") and node B and node C are low ("0"). If radiation strikes node B, radiation-induced charge on node B may cause the voltage on node B to go high (e.g., to positive power supply voltage Vcc or even higher). When the voltage on node B goes high, transistor T1 will be turned off and transistors T3 and T4 will be turned on. Even though transistor T4 is turned on, transistor T6, which is controlled by node C, remains on. With both transistor T4 and T6 on, the voltage on node NC falls to a voltage between Vcc and Vss (e.g., to about Vcc/2 which is roughly midway between the positive power supply voltage of Vcc applied to transistor T6 and the ground voltage Vss of 0 volts applied to transistor T4).

Because transistor T3 is relatively weak (e.g., transistor T3 has a relatively large resistance even when turned on) and because of the capacitance of node A, the falling voltage on node NC does not propagate rapidly to node A. In addition, even though transistor T1 is turned off and node NB is therefore decoupled from Vcc, the falling voltage on node NC does not propagate rapidly to node NB (e.g., because of the weakness of transistors T2 and T3 and the capacitance of node A). Nodes A and NB therefore tend to retain their original high values, despite the radiation strike.

Because capacitance of node A and the high resistance of transistors T2 and T3 tends to hold nodes A and NB high, the relatively unperturbed signals on node A and NB serve as stabilizing control signals that are applied to the gates of transistor T7 and T8 (as well as T9). Because transistor T8 remains in its original state (turned on), transistor T8 will pull node B back to its original state (e.g., transistor T8 will discharge the radiation-induced charge on node B into the ground power supply line for cell 20). Also, because node NB is relatively unperturbed, transistor T7 remains turned off.

Even though the voltage on node NC may have fallen to a voltage between Vcc and Vcc such as Vcc/2, transistor T10 is not strongly turned off and, because node A remains at "1," transistor T9 is never turned on. Node C at the output of inverter INV3 therefore remains low ("0"). Because node C stays low, transistor T6 stays on, pulling node NC back to its original high level (e.g., pulling NC to Vcc).

Eventually, the radiation-induced charge on node B that momentarily elevated the voltage on node B will dissipate and node B will return to its normal (pre-strike) state of 0 volts.

Once B reaches 0 volts, transistor T1 turns on and transistors T3 and T4 turn off and node NC regains its pre-strike voltage of Vcc.

As this example demonstrates, the architecture of cell 20 allows the cell to retain its stored data value (a stored "0" in this example), even when a node in the cell is struck by radiation.

Figure 3B:
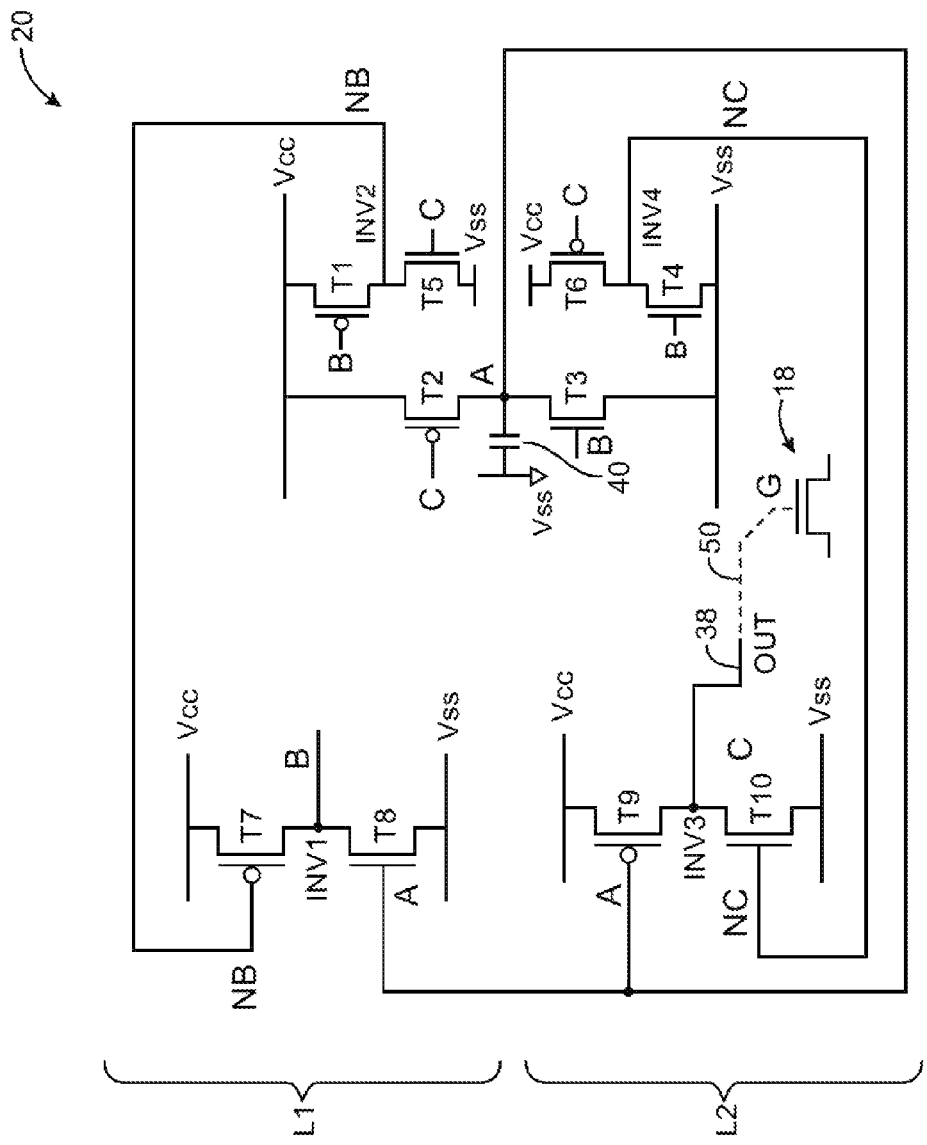
FIG. 3B is a diagram of an illustrative memory cell in accordance with an embodiment of the present invention.

If desired, the common node A can be coupled to power supply lines. For example, transistors or other circuit components can be coupled between a positive power supply line and node A and can be coupled between a ground power supply line and node A. An illustrative arrangement in which transistor T2 is coupled between positive power line Vcc and node A and in which transistor T3 is coupled between ground line Vss and node A is shown in FIG. 3B. As with the arrangement of FIG. 3A, the gates of transistors T2 and T3 may be controlled by nodes C and B, respectively.

Figure 3C:
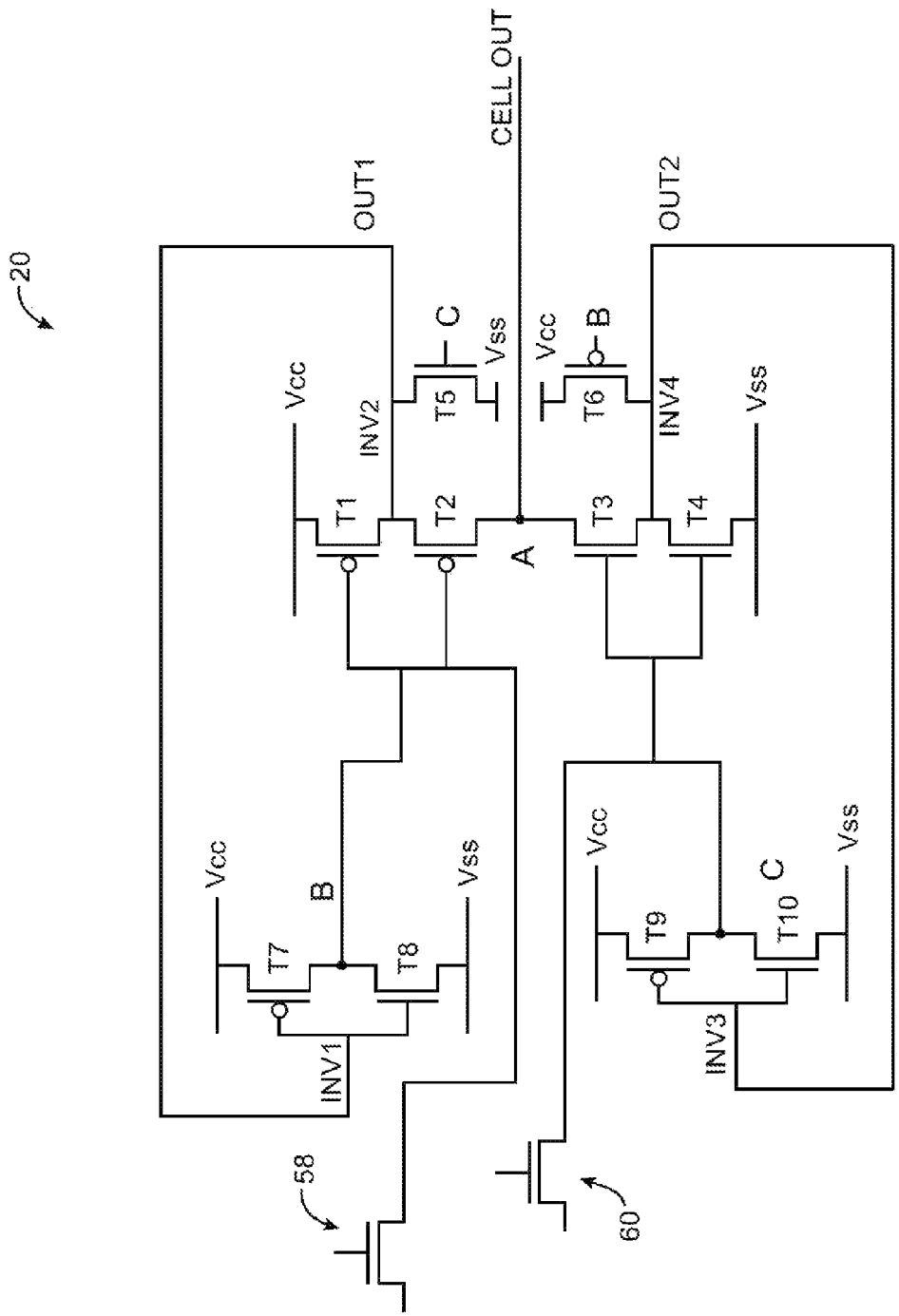
FIG. 3C is a diagram of an illustrative memory element that may have soft error upset immunity in accordance with an embodiment of the present invention.

Another illustrative configuration for a memory element 20 that is resistant to soft error upset events is shown in FIG. 3C. Memory element 20 may also be referred to herein as a memory cell. The cell 20 of FIG. 3C contains two separate latches (shown on the upper and lower halves of the diagram, respectively). Node A represents the output of the cell (e.g., CELL OUT). In a programmable logic device in which the cell 20 of FIG. 3C serves as a configuration random-access memory cell, the line connected to node A may represent the cell output and may be connected to the gate of an NMOS or PMOS transistor in a programmable logic circuit. Depending on the state of node A, this transistor may be turned on or off as needed to configure the programmable logic circuit.

The FIG. 3C cell (e.g., memory cell 20) can store either a logic one or a logic zero. Both states of the cell are stable. Consider, as an example, the situation in which nodes B and C are low (e.g., nodes B and C are at a ground voltage such as Vss). When node B is low, transistors T1 and T2 are turned on. Because transistor T1 is on, node OUT1 is taken high (e.g., node OUT1 is taken to a positive power supply voltage such as Vcc). With transistors T1 and T2 both on, node A is high. Node C is low, so transistor N3 is off, leaving node OUT1 high. The signal OUT1 feeds the input to inverter INV1, formed by transistors T7 and T8. Inverter INV1 inverts the high OUT1 signal, so node B is low. The upper half of the cell is therefore stable with node A high.

In the lower half of FIG. 3C, signal C is low, so transistors N1 and N2 are off allowing node A to remain high. Node B is low, so transistor P3 is on and pulls node OUT2 high. The high signal on node OUT2 signal is routed to the input of inverter INV3. Transistors T9 and T10 in inverter INV3 invert the high signal on node OUT2 and produce a low signal on the output of INV3 (e.g., on node C). The lower half of the cell is therefore stable with node A high. The upper and lower halves of the cell are similarly stable when node A is low.

The strengths of transistors T1 and T2 may be configured so that transistor T2 is weaker than transistor T1. Transistors N1 and N2 may be similarly ratioed. In the event of a soft error event on node A, the ratio between these transistors helps to limit the voltage excursion on nodes OUT1 and OUT2. Inverters INV1 and INV3 may have trip point voltages that are selected to make inverters INV1 and INV3 immune to upset in this scenario.

Transistors N1 and T2 may limit voltage excursions on node A. For example, if a voltage excursion caused by a soft error event attempts to pull node A high above the positive power supply voltage Vcc plus a forward bias diode drop voltage, the p-n diode junction of transistor T2 will be forward biased and node A will discharge into the n-well of transistor T2. Because the n-well of transistor T2 is biased by a positive power supply line (at Vcc), node A will discharge into the positive power supply line. Conversely, if a voltage excursion caused by a soft error event pulls node A low below the ground power supply voltage Vss minus a forward bias diode drop voltage, the p-n diode junction of transistor N1 will be forward biased and node A will discharge into the p-well of transistor N1 (which is grounded to a ground power supply line at Vss).

For example, consider the situation in which node A is high. If a soft error event occurs on node A, node A will be pulled low towards 0 volts. Transistors T1 and T2 will act as a voltage divider. By proper selection of the strengths of transistors T1 and T2, the minimum voltage to which node OUT1 will be reduced can be ensured to be greater than the minimum trip point voltage needed to flip the output of inverter INV3. Transistors N1 and N2 can similarly be ratioed so that node OUT2 will not drop sufficiently to cause the output of inverter INV3 to flip. Because transistors T2 and N1 limit voltages excursions on node A to between Vss minus a forward bias diode drop voltage and Vcc plus a forward bias diode drop voltage, transistors N1, N2, T1, and T2 can be appropriately sized to ensure that the maximum voltage swings that can occur on nodes OUT1 and/or OUT1 are less than the minimum voltage swing needed to flip the output of inverters INV1 or INV3. The cell 20 of FIG. 3C therefore may exhibit enhanced immunity to soft error upsets.

Memory cell 20 may have two control transistors 58 and 60 that can be used to load data into cell 20. Transistor 58 may be turned on by a first write signal (WRITE1) and transistor 60 may be turned on by a second write signal (WRITE2). With one suitable arrangement, during a memory element write operation, transistors 58 and 60 can be turned on by the respective write signals WRITE1 and WRITE2 to connect cell 20 to data lines and to load data into the memory cell 20 from memory element data loading circuitry such as circuitry in device 10 and/or external memory element data loading circuitry. Read operations can also be performed using transistors 58 and 60.

Figure 4:
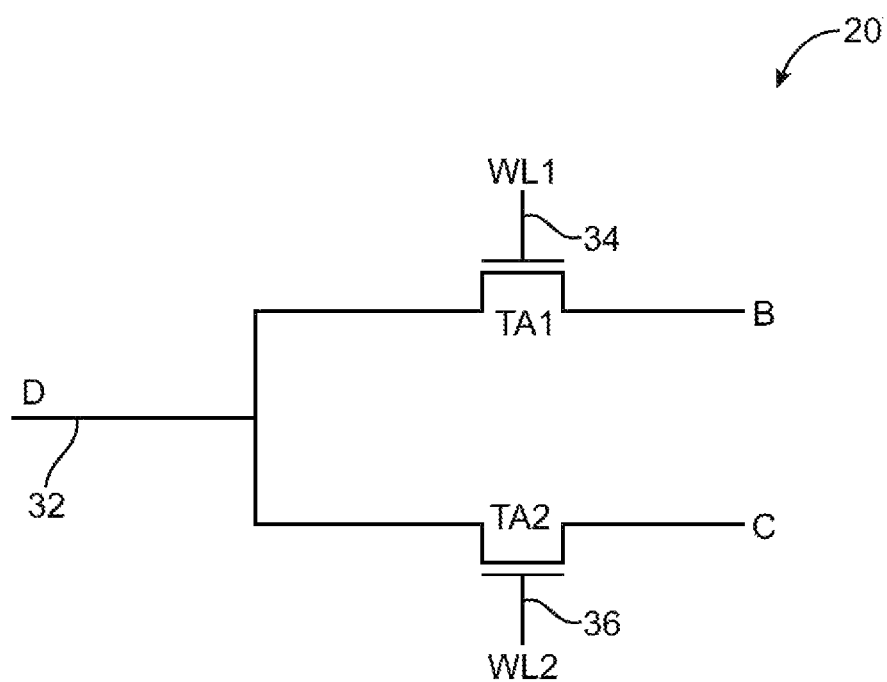
FIG. 4 is a diagram of illustrative address transistors that may be a part of a memory cell of the type shown in FIG. 3A in accordance with an embodiment of the present invention.

As shown in FIG. 4, memory cell 20 may include address transistors TA1 and TA2. Data D can be conveyed to cell 20 over a single data line 32 through address transistors TA1 and TA2.

Address signals WL1 and WL2 may be provided to the gates of respective address transistors TA1 and TA2 via address lines 34 and 36. The value of address signals WL1 and WL2 can be used to control address transistors TA1 and TA2, respectively. Transistors TA1 and TA2 may be turned off during normal operation by taking signals WL1 and WL2 low. In this situation, output signal OUT on line 38 of FIG. 3A may be used as a static control signal to control programmable logic (e.g., by being applied to the gate G of a programmable logic metal-oxide-semiconductor transistor 18 by path 50 as shown in FIG. 3A).

When it is desired to write data into cell 20, WL1 and WL2 may both be asserted (i.e., taken high in configurations in which pass gates TA1 and TA2 are implemented using NMOS transistors). The voltage levels used for the asserted address signals may be elevated ("overdriven") with respect to normal power supply levels to improve write margin. If desired, write margin may be improved by lowering the magnitude of the power supply for cell 20 to weaken cell 20 during writing. The power to cell 20 may be lowered by lowering the magnitude of Vcc on terminal 40 from 1.5 volts to 1.2 volts (as an example). When it is desired to read data from cell 20, signal WL1 may be asserted (e.g., taken high), while signal WL2 is deasserted (e.g., taken low). The use of two address transistors allows data to be written onto both logically equivalent nodes B and C at the same time, ensuring that the state of the cell can be disturbed sufficiently for data writing. The use of a single address transistor during read operations ensures that the state of the cell will not be disturbed for data reading.

During normal operation as CRAM memory, each cell 20 in array 28 may be used to provide a corresponding output signal OUT at its output line 38 as shown in FIG. 3A. The OUT signals may serve as static control signals that control programmable logic 18. In this mode of operation, the address signals WL1 and WL2 in each cell 20 are deasserted (e.g., WL1 and WL2 are low), so that address transistors TA1 and TA2 in each cell 20 are off. With address transistors TA1 and TA2 off, data signal line 32 will be isolated from the latch transistors in cell 20 (i.e., transistors T1, T4, T5, T6, T7, T8, T9, and T10).

With transistors TA1 and TA2 off, cell 20 holds its loaded data value and exhibits good immunity to radiation-induced upset events.

The contents of cell 20 may be read by address decoder and data register circuitry 24 by taking one of the address signals high, while leaving the other address signal low. For example, WL1 may be taken high and WL2 may remain low. When array 28 is used as an SRAM array, read operations may be performed to retrieve data for processing. When array 28 is used as a CRAM array, read operations may be performed to confirm that configuration data has been properly loaded into array 28.

The immunity of cell 20 to undesired changes in state from radiation strikes helps to ensure that array 28 will exhibit stable operation in a variety of circumstances. However, this stability can make it challenging to write data into cell 20.

The resistance of cell 20 to changes in state can be weakened for write operations by lowering the magnitude of voltage Vcc on terminal 40. For example, if a nominal Vcc value of 1.5 volts is used during normal operation (as an example), the value of Vcc may be temporarily lowered to a reduced value of 1.2 volts (or other suitable voltage). This weakens cell 20 and facilitates data loading. Write margin can also be increased by overdriving the address signals WL1 and WL2.

The resistance of node A to rapid changes may somewhat slow write operations for cell 20. For example, data may need to be driven onto cell 20 through address transistors TA1 and TA2 for a sufficiently long time to ensure that node A, which responds slowly to changes to nodes NB or NC, has reached its correct state.

Data loading may also be facilitated by ensuring that two or more of the nodes in cell 20 are driven in parallel through the address transistors. In the example of FIG. 3A, there are two address transistors TA1 and TA2 and these address transistors are respectively used to drive signals onto nodes B and C in parallel. Data signal D is loaded onto node B through transistor TA1. At the same time, data signal D is loaded onto node C through transistor TA2. If only one of these nodes was accessed during data loading operations, cell 20 would be more resistant to a state change. However, when both transistors TA1 and TA2 are used in parallel to drive data onto two nodes in cell 20, the state of cell 20 will change more easily.

If desired, the strengths of the signals in cell 20 can be varied. For example, the value of Vcc can be increased during normal operation to ensure that the value of OUT is sufficiently large to turn on associated programmable logic transistors in programmable logic 18. Temporarily elevated voltage levels (sometimes referred to as overdrive signals) can also be used for address signals WL1, WL2, and data signal D. These schemes may be used in place of or in combination with arrangements in which the voltage of Vcc is temporarily lowered (e.g. to 1.2 volts from a nominal value of 1.5 volts) during data write operations.

It is not necessary for address transistors TA1 and TA2 to be connected to nodes B and C. For example, transistors TA1 and TA2 may be connected to nodes NB and NC. If desired, a differential driving scheme may be used in which TA1 routes data D to a true node (e.g., B or C), whereas TA2 routes complementary data ND to a complementary node (e.g., NB or NC). An advantage of arrangements of the type shown in FIG. 4 is that they avoid the use of an additional line 32 to handle complementary data signals ND, thereby maximizing usage of available integrated circuit area.

Data loading schemes based on three address transistors or four address transistors may also be used. An advantage of twelve transistor (12T) cell configurations of the type shown in FIGS. 3 and 4 is that this type of configuration may be less complex and may consume less integrated circuit area than other configurations.

Figure 5A:
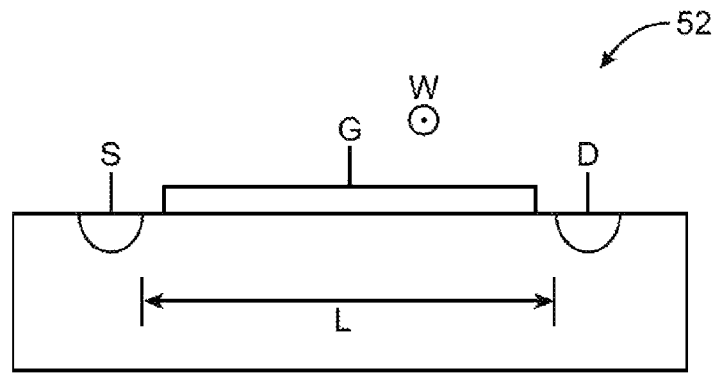
FIG. 5A is a side view of an illustrative transistor that may be used in a memory cell of the type shown in FIG. 3A in accordance with an embodiment of the present invention.

FIG. 5A is a side view of an illustrative transistor that may be used in cell 20. As shown in FIG. 5A, transistor 52 has source terminal S, gate terminal G and drain terminal D. FIG. 5A also show how gate terminal G has physical dimensions such as length L and width W (the width is into the plane of FIG. 5A). Gate terminal G has a gate oxide layer and a gate conductor).

Figure 5B:
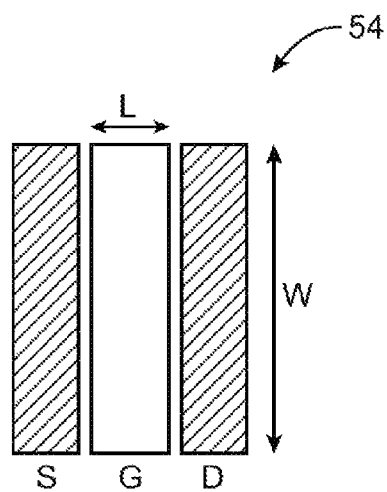
FIG. 5B is a top view of an illustrative transistor that may be used in a memory cell of the type shown in FIG. 3A in accordance with an embodiment of the present invention.

A relatively strong transistor 54 is shown FIG. 5B. Transistor 54 is relatively strong because of the relative dimensions of its length L (e.g., the distance between the source and drain terminals of the transistor) and its width. Because the length (L) of transistor 54 is relatively short when compared to the width (W) of transistor 54, transistor 54 will have a relatively low resistance when turned on (e.g., when an appropriate voltage is applied to gate terminal G to create a conductive path between source terminal S and drain terminal D).

Figure 5C:
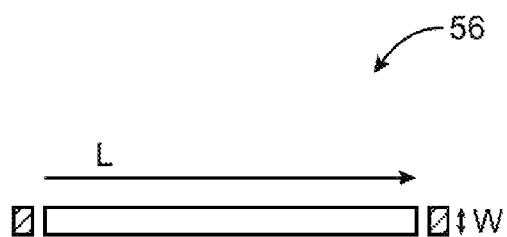
FIG. 5C is a top view of an illustrative transistor that may be used in a memory cell of the type shown in FIG. 3A in accordance with an embodiment of the present invention.

A relatively weak transistor is shown FIG. 5C. Because the length (L) of transistor 56 is relatively long when compared to the width (W) of transistor 56, transistor 56 will have a relatively high resistance when turned on (e.g., when an appropriate voltage is applied to gate terminal G to create a conductive path between source terminal S and drain terminal D).

With one suitable arrangement, transistors T1, T4, T5, T6, T7, T8, T9, T10, TA1, and TA2 may be formed from transistors similar in proportions to transistor 54 of FIG. 5B (e.g., a relatively strong transistor) while transistors T2 and T3 may be formed from transistors similar to transistor 56 of FIG. 5C (e.g., a relatively weak transistor). For example, the lengths of transistors T2 and T3 may be about 1 micrometer while the widths of transistors T2 and T3 may only be about 0.12 micrometers. Other aspect ratios (L/W) may also be used (e.g., L/W>1, L/W>2, L/W>5, L/W>10, etc.).

Memory cell 20 may be formed on a silicon substrate in any suitable layout. If desired, the layout of memory cell 20 on the silicon substrate may be selected to minimize the probability of cell 20 experiencing soft error upsets. For example, the probability of a multi-node upset event may be reduced if nodes are physically separated from each other on the silicon substrate. Because of the relatively long transistors (T2 and T3) in cell 20, an elongated layout of cell 20 may minimize the probably of multi-node upset event while also minimizing the area consumed by cell 20 on its silicon substrate. Minimizing the area consumed by memory cells is highly desirable.

Figure 6A:
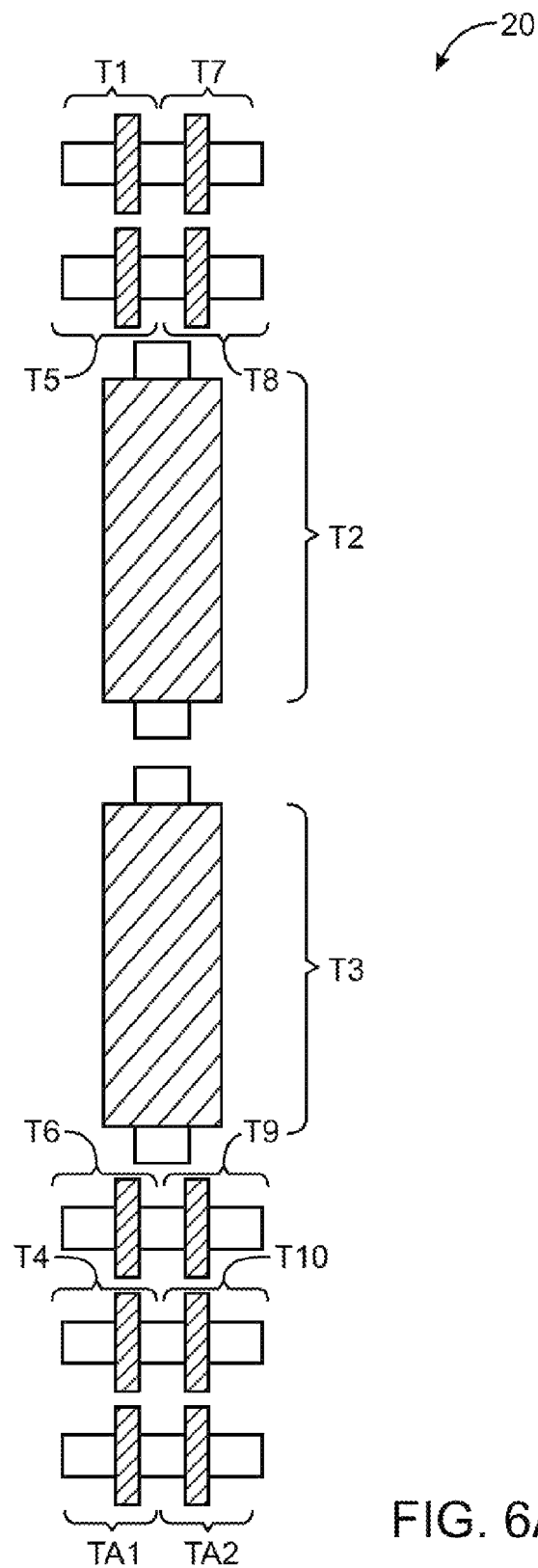
FIGS. 6A and 6B are top views of an illustrative layout for a memory cell in accordance with an embodiment of the present invention.
Figure 6B:
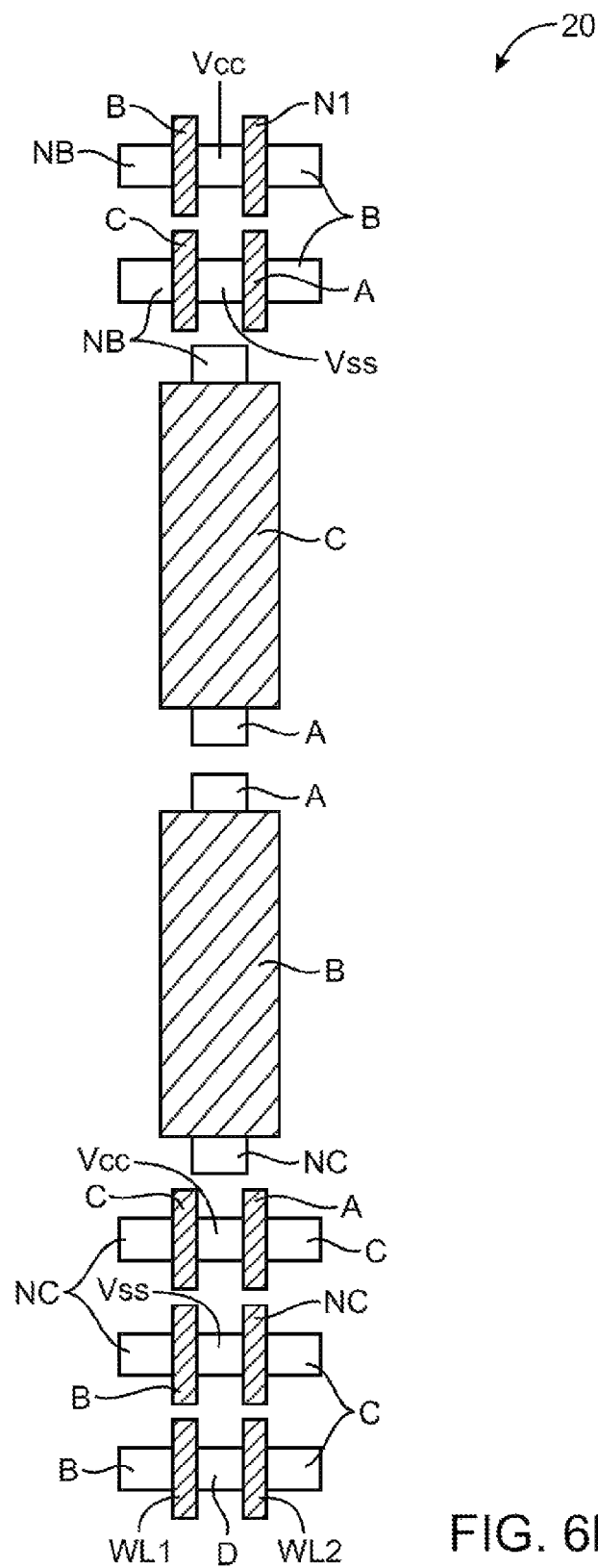

One potential layout for memory cell 20 is shown in FIGS. 6A and 6B. As shown in FIG. 6A, cell 20 may be arranged in a relatively elongated layout in which transistors T2 and T3 are placed end to end. Transistors T1, T5, T7, and T8, which form inverters INV1 and INV2 and latch L1, may be placed at a first end of cell 20. Transistors T6, T4, T9, and T10, which form inverters INV3 and INV4 and latch L2, may be placed at a second end of cell 20 opposite the first end. Address transistors TA1 and TA2 may also be placed at the second end of cell 20. This is merely one possibility and, in general, any suitable arrangement may be used. With one suitable arrangement, cell 20 may have a length of approximately 2 micrometers (from end to end) and a width of approximately 0.25 micrometers.

The layouts of memory cell 20 shown in FIGS. 6A and 6B may improve the resistance of the memory cell 20 to soft error upset events. For example, by placing certain transistors such as transistors T1 and T7 in different transistor wells than other transistors T6 and T9, the soft error upset event resistance of memory cell 20 may be increased.

The relatively elongated layouts of FIGS. 6A and 6B may also increase the resistance of memory cell 20 to soft error upset events. Because these layouts increase the physical separation of transistor wells and nodes that are at opposite ends of the memory cell (relative to a square memory cell layout), the probability of a soft error upset event disturbing transistors or nodes at opposite ends of the memory cell is reduced. At the same time, the relatively elongated layouts minimize the total area occupied by the memory cells, because the memory cells are relatively narrow.

The nodes for each of the transistors in cell 20 shown in FIG. 6A are identified in FIG. 6B. While not shown in FIG. 6B, cell 20 will also include conductive lines that interconnect the nodes so that all of the common nodes are connected together (e.g., so that the A nodes are connected together, the B nodes are connected together, the NB nodes are connected together, the C nodes are connected together, the NC nodes are connected together, and the C nodes are connected together).

The gates of the transistors in cell 20 are illustrated by the shaded regions of FIGS. 6A and 6B and source drain regions are unshaded.

If desired, the resistors (or resistive transistors such as T2 and T3) that are connected between the outputs of the second and fourth inverters can be replaced with other suitable circuit components. For example, an inverter may be provided that has an output that is connected to the common output line (node A) and an input connected to node B or node C. The time constant of the inverter (i.e., its response time to a changing input) may be configured to be equivalent to the RC delay associated with the resistors (or resistive transistors T2 and T3), thereby ensuring the node A is resistive to rapid changes due to upset events. Other circuit elements may also be used in place of (or in addition to) resistors, resistive transistors, and inverters, provided that node A is appropriately driven in a time-delayed fashion (i.e., with a time constant that is longer than the expected duration of a typical upset event).

The memory elements of FIGS. 3A, 3B, and 3C include five inverter-like (inverter-type) transistor-based circuits. Each inverter-type circuit may be formed from two associated transistors. For example, in the FIG. 3B example, transistors T7 and T8 form a first inverter-like circuit, transistors T1 and T5 form a second inverter-like circuit, transistors T9 and T10 form a third inverter-like circuit, transistors T4 and T6 form a fourth inverter-like circuit, and transistors T2 and T3 form a fifth inverter-like circuit. These types of arrangements provide memory element 20 with partial immunity to soft error upsets that disturb multiple nodes in memory element 20. For example, memory element 20 of FIG. 3B may be immune to soft error upsets that disturb any two of the logically equivalent A, NB, and NC nodes.

Figure 7:
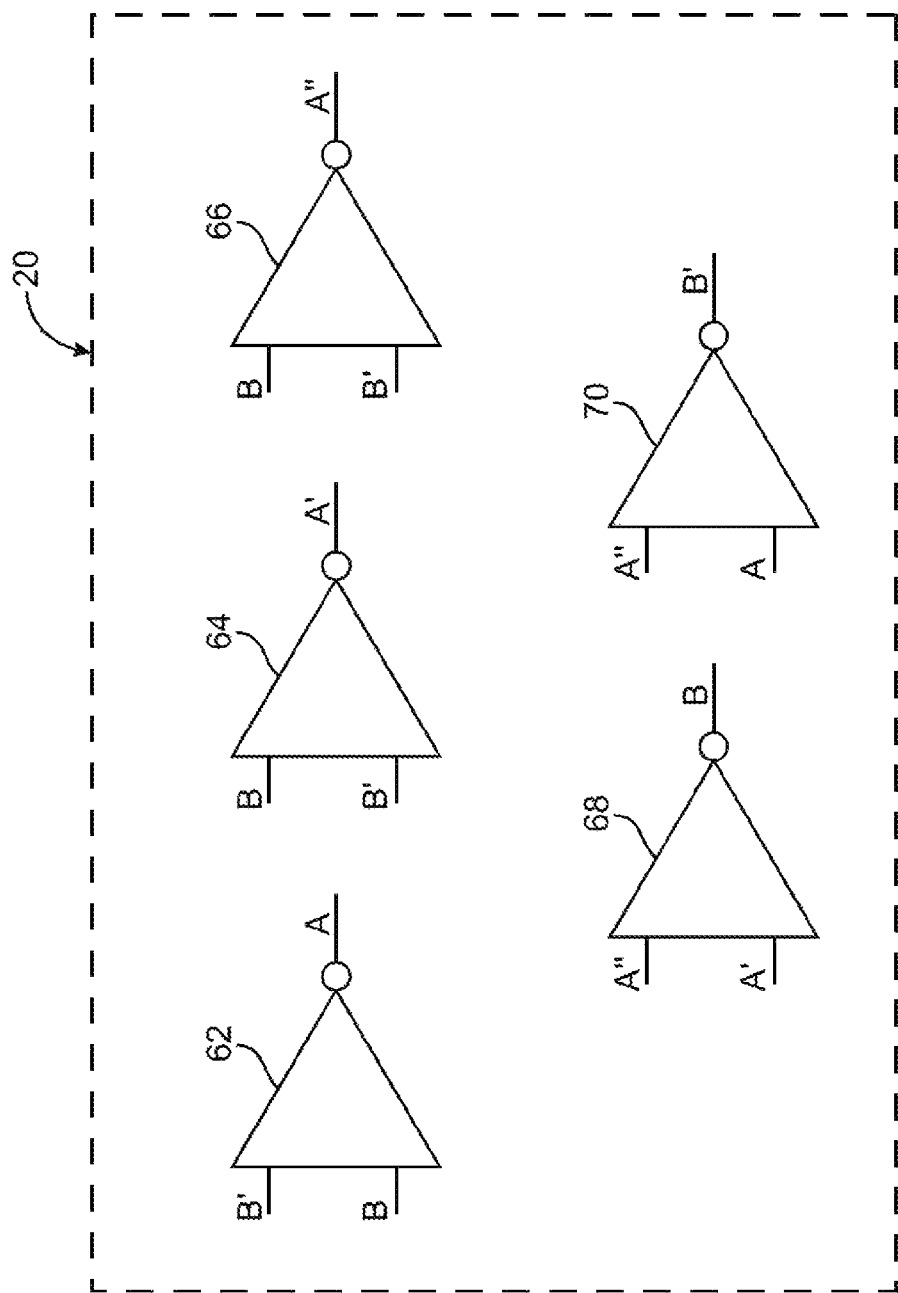
FIG. 7 is a schematic diagram of an illustrative memory cell that may include five inverter-like transistor-based circuits and that may be somewhat resistance to multi-node soft error upsets in accordance with an embodiment of the present invention.

A generalized schematic diagram of a memory cell that includes five inverter-like transistor-based circuits is shown in FIG. 7. As one example, memory cell 20 of FIG. 7 may include inverter-like circuits 62, 64, 66, 68, and 70, which drive signals onto nodes A, A', A", B, and B', respectively.

Memory cell 20 of FIG. 7 may be resistant to two node soft error upset events. For example, when any two of nodes A, A', and A" are disturbed in an upset event, memory cell 20 may not flip states and may maintain stored data. Nodes A, A', and A" from the FIG. 7 example may be logically equivalent (i.e., they may all be at a logic "1" or all may be at a logic "0" in the absence of an upset event) and may respectively correspond to nodes A, NB, and NC from the examples of FIGS. 3A, 3B, and 3C. Similarly, nodes B and B' may be logically equivalent and may correspond to nodes B and C, respectively.

If desired, the number of inverter-like circuits used in a memory cell may be larger than five to provide the memory cell with an increased resistance to multi-node soft error upsets. In general, memory cells may be formed from any desired number of interconnected inverter-like circuits (e.g., four, five, six, seven, eight, more than eight, etc.). As the number of inverter-like circuits in a memory cell is increased, the number of nodes that can be upset without flipping the state of that memory cell generally increases correspondingly.

Figure 8:
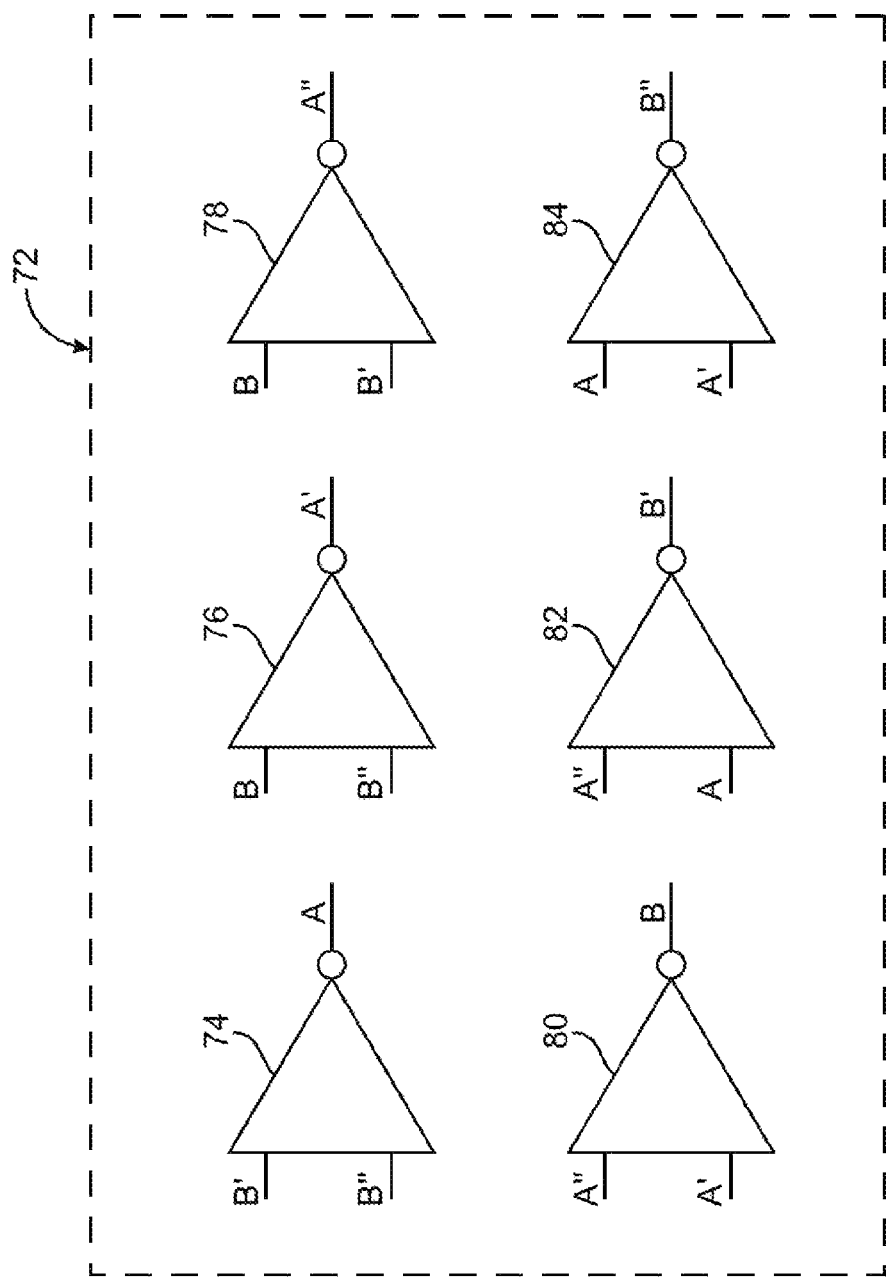
FIG. 8 is a schematic diagram of an illustrative memory cell that may include six inverter-like transistor-based circuits and that may be resistant to soft error upsets that disturb any two nodes in the memory cell in accordance with an embodiment of the present invention.

An example of a memory cell that includes six interconnected inverter-like circuits is shown in FIG. 8. As shown in FIG. 8, memory element 72 may include interconnected inverter-like circuits 74, 76, 78, 78, 80, 82, 84. Each of the inverter-like circuits may have a unique set of inputs. With this type of arrangement, memory cell 72 may be resistant to two node upset events. For example, memory cell 72 may be resistant to an upset event that disturbs any two of nodes A, A', A", B, B', and B". Nodes A, A', and A" may be logically equivalent and complementary nodes B, B', and B" may be logically equivalent.

In general, inverter-like circuits 74, 76, 78, 78, 80, 82, 84 may be interconnected using any suitable scheme. The interconnection scheme of inverter-like circuits 74, 76, 78, 78, 80, 82, 84 illustrated in FIG. 8 is merely one example.

Inverters such as inverters INV1, INV2, INV3, and INV4 from the examples of FIGS. 3A, 3B, and 3B and the circuits of FIGS. 7 and 8 are sometimes referred to as inverter-type or inverter-like circuits because the circuits function as inverters but have independent inputs. In conventional inverters, the gates of the PMOS and NMOS transistors are shorted together, whereas in the inverter circuits of FIGS. 3A, 3B, 3B, 7, and 8 the inputs are connected to distinct nodes to provide immunity to soft error events.

Each of the inverter-like circuits of FIGS. 7 and 8 may be formed using any suitable circuits. For example, one or more of the circuits 62, 64, 66, 68, 70, 74, 76, 78, 80, 82, and 84 may be formed from a PMOS transistor and an NMOS transistor connected together in series between a pair of power supply rails. The PMOS and NMOS transistors may receive logically equivalent inputs from different sources. The output of the inverter-like circuits may be the logical inversion of each of the inputs. The arrangement of the inverter-like circuits and the way in which the inverter-like circuits are interconnected may be selected to optimize the resistance of a memory element to soft error upset events. In particular, the memory element may be configured such that a soft error upset event to one or more nodes does not change the overall state of the memory element (e.g., so that the memory element returns to the state it was in before the soft error event temporarily disturbed the memory element).

An example of an arrangement in which an inverter-like circuit is formed from PMOS and NMOS transistors that are connected together in series between a pair of power supply rails and receive logically equivalent inputs from different sources is illustrated by transistors T7 and T8 in FIG. 3A. If desired, one of more of the circuits of FIGS. 7 and 8 may be implemented using an inverter with two inputs that are tied together. As another example, one or more of the circuits may be formed with more than two transistors connected together in series.

Figure 9:
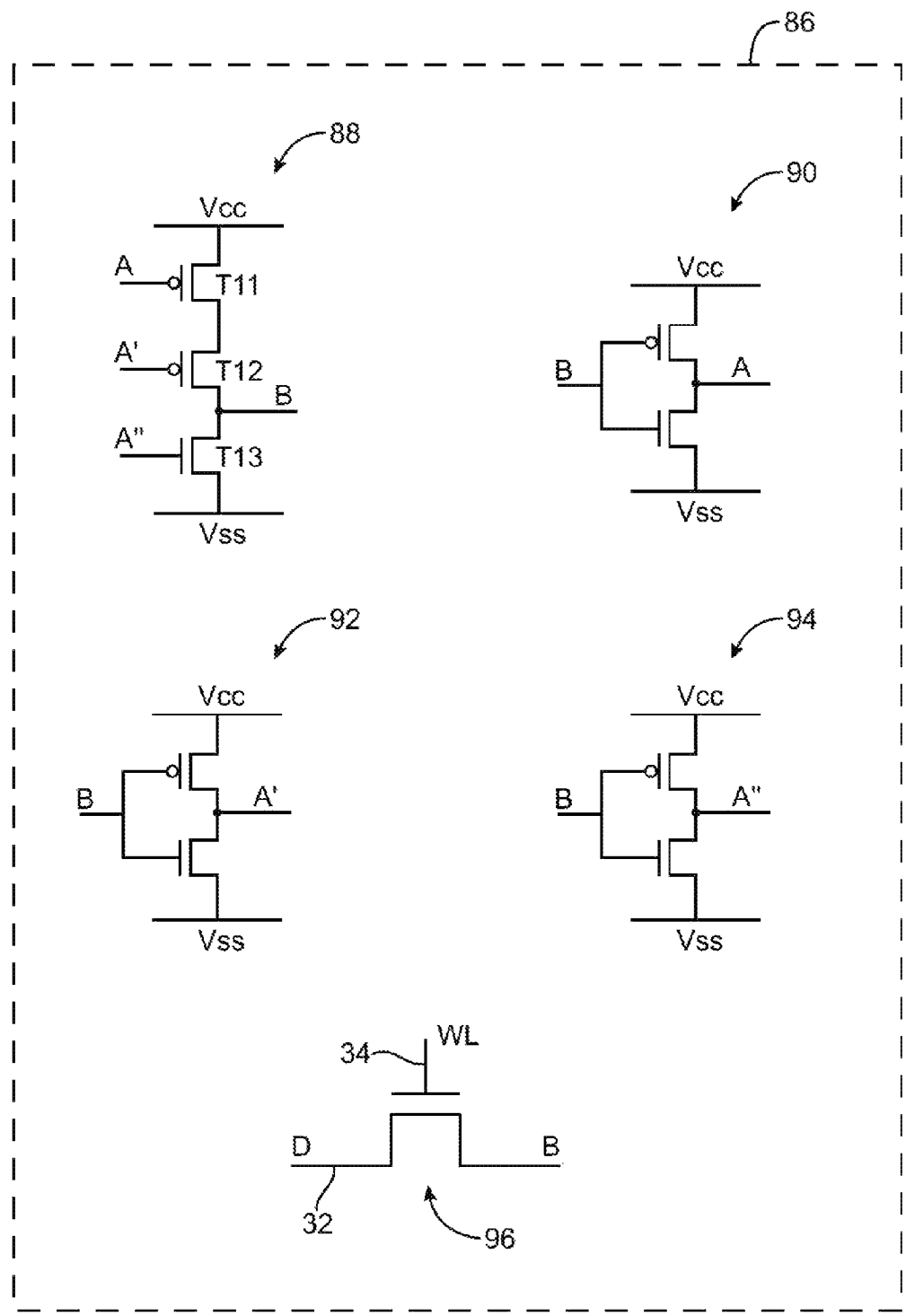
FIG. 9 is a diagram of an illustrative memory cell that may include at least one inverter-like circuit that includes three transistors connected together in series in accordance with an embodiment of the present invention.

An example of a memory element that includes at least one inverter-like circuit formed with more than two transistors connected together in series is shown in FIG. 9. As shown in FIG. 9, memory element 86 may include an inverter-like circuit 88 with three transistors T11, T12, and T13 connected in series between a pair of power supply lines. Each of the transistors T11, T12, and T13 may be controlled by a logically equivalent input that is separately generated. For example, transistor T11 may be controlled by an input signal A that is generated by inverter 90, transistor T12 may be controlled by an input signal A' that is generated by inverter 92, and transistor T13 may be controlled by an input signal A" that is generated by inverter 94. If desired, transistors T11 and T12 may be PMOS transistors and transistor T13 may be an NMOS transistor.

Memory element 86 of FIG. 9 may be resistant to multi-node soft error upset events. A soft error upset event that disturbs any two of the nodes A, A', and A" may not cause the state of node B to flip completely.

As a first example, if nodes A, A', and A" are initially at a logic one (i.e., transistors T11 and T12 are off, transistor T13 is on, and node B is at a logic zero level), a soft error upset event that pulls nodes A and A' low may turn on transistors T11 and T12. However, because transistors T13 remains on, the signal on node B does not flip completely from its original logic zero level but instead is pulled to a voltage level somewhere between the logic zero and logic one levels, thereby potentially allowing memory element 86 to recover from the soft error upset event and maintain its stored data.

As a second example, if nodes A, A', and A" are initially at a logic one, a soft error upset event that pulls node A or node A' low and that pulls node A" low merely isolates node B from both power supply rails (e.g., node B is left "floating"). Therefore, the voltage level on node B remains relatively stable and inverters 90, 92, and 94 recharge the disturbed nodes (i.e., node A or A' and node A") to their pre-disturbed levels (i.e., the initial logic one levels), thereby allowing memory element 86 to recover from the soft error upset event and maintain its stored data.

Memory element 86 may include one or more address transistors such as address transistor 96. Address transistor 96 may be controlled by word line 34. When address signals on word line 34 are asserted, address transistors 96 may drive data from data line 32 onto node B of memory element 86 (as one example).

If desired, a memory element may be formed with more than one inverter-like circuit that is formed from more than two transistors connected together in series. For example, a memory element may be formed from two, three, four, five, six, or more than six inverter-like circuits each of which includes at least three transistors connected together in series between a pair of power supply rails. With one suitable arrangement, a memory element may be formed from six inverter-like circuits, each of which is formed from three transistors connected together in series between a pair of power supply rails. This type of arrangement is illustrated in the example of FIG. 10.

Figure 10:
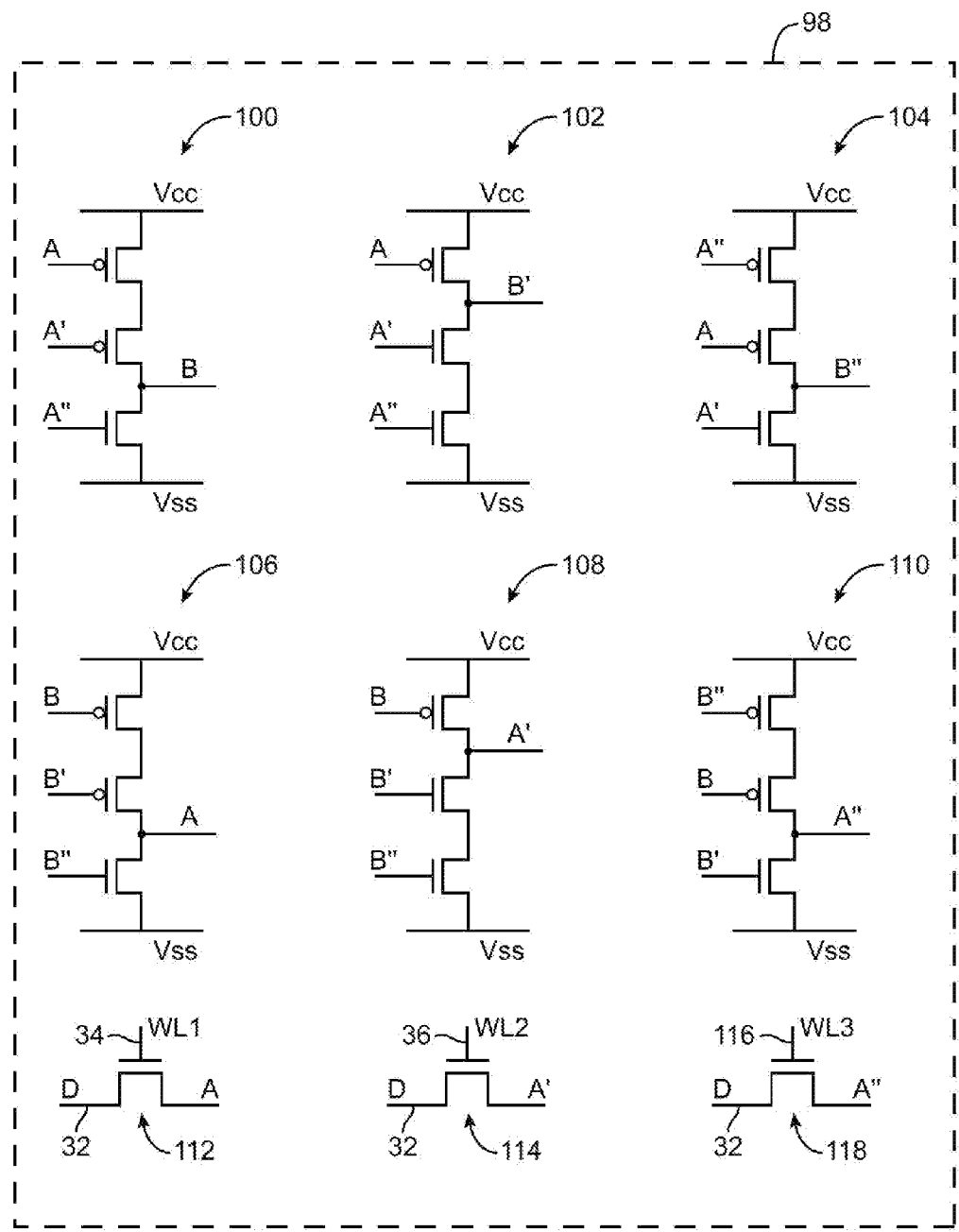
FIG. 10 is a diagram of an illustrative memory cell that may include up to six inverter-like circuits that each include three transistors connected together in series in accordance with an embodiment of the present invention.

As shown in FIG. 10, memory element 98 may include inverter-like circuits 100, 102, 104, 106, 108, and 110. Each of the inverter-like circuits 100, 102, 104, 106, 108, and 110 may include three or more transistors connected together in series. Circuits 100, 104, 106, and 110 may include a pair of PMOS transistors and an NMOS transistor connected together in series and circuits 102 and 108 may include a pair of NMOS transistors and a PMOS transistor connected together in series (as examples). With one suitable arrangement, the output of each of the inverter-like circuits of FIG. 10 may be taken at the junction between the PMOS and NMOS transistors of each circuit.

Memory element 98 may be resistant to soft error upset events on any two of the logically equivalent nodes A, A', and A" or on any two of the logically equivalent nodes B, B', and B". In addition, depending on how memory element 98 is configured (e.g., depending on how the inverter-like circuits are interconnected and depending on the layout of memory element 98), memory element 98 may be resistant to soft error upset events that disturb up to two of the logically equivalent nodes A, A', and A" and that simultaneously disturb up to two of the logically equivalent nodes B, B', and B". The examples and explanation of soft error resistance described above in connection with the inverter-like circuit 88 of FIG. 9 also applies to each of the inverter-like circuits 100, 102, 104, 106, 108, and 110 of memory element 98 in FIG. 10.

The exact arrangement used in FIG. 10 is merely one example. In general, it is desirable that each of the inverter-like circuits have a distinct combination of logically equivalent inputs and transistor combinations to maximize the soft error upset resistance of memory cell 98. For example, it is desirable that each of the inverter-like circuits of memory cell 98 has a different arrangement of inputs (as in circuits 100 and 104) and/or has a different arrangement of transistors (as in circuits 100 and 102).

Memory cell 98 of FIG. 10 may include any suitable number of address transistors. As one example, memory cell 98 may include three address transistors 112, 114, and 118. Address transistors 112, 114, and 118 may be controlled by word lines 34, 36, and 116, respectively, or may be controlled by a common word line. As one example, when address signals are asserted to turn on address transistors 112, 114, and 118, the address transistors 112, 114, and 118 may drive data signals from one or more data lines such as data line 32 onto nodes A, A', and A", respectively.

The physical layout of memory cell 86 of FIG. 9 and memory cell 98 of FIG. 10 may also impact the resistance of the memory cells 86 and 98 to soft error upset events and may impact the area of circuit real estate consumed by the memory cells 86 and 98. It may therefore be desirable to lay out memory cells 86 and 98 in a relatively thin and long arrangement to provide maximum separation between critical nodes while minimizing the physical area consumed by memory cells 86 and 98 (see, e.g., the examples of FIGS. 6A and 6B).

The foregoing is merely illustrative of the principles of this invention and various modifications can be made by those skilled in the art without departing from the scope and spirit of the invention.

What is claimed is:

1. A memory element comprising:
   first, second, third, fourth, and fifth transistor pairs each of which forms an inverter-type circuit and that collectively form a bistable cell, wherein each of the transistor pairs receives at least two distinct logic signal inputs, wherein the at least two distinct logic signal inputs comprise a first logic signal input from one of the transistor pairs of the first, second, third, fourth, and fifth transistor pairs, wherein the at least two distinct logic signal inputs further comprise a second logic signal input from another one of the transistor pairs of the first, second, third, fourth, and fifth transistor pairs, and wherein each of the first, second, third, fourth, and fifth transistor pairs comprises:
   first and second transistors that are connected together in series; and
   a common node between the first and second transistors, wherein the first transistor in the first transistor pair has a first source-drain terminal connected to the common node of the first transistor pair and has a second source-drain terminal connected to the common node of the second transistor pair.

2. The memory element defined in claim 1 wherein each of the first, second, third, fourth, and fifth transistor pairs comprises a first input terminal coupled to one of the first, second, third, fourth, and fifth transistor pairs and a second input terminal coupled to another one of the first, second, third, fourth, and fifth transistor pairs.

3. A memory element comprising:
   five transistor pairs that collectively form a bistable cell, wherein each of the five transistor pairs forms an inverter-type circuit, wherein each of the five transistor pairs receives at least two distinct logic signal inputs and wherein each of the five transistor pairs comprises:
   a p-channel transistor having a gate and a source-drain terminal;
   an n-channel transistor having a gate and a source-drain terminal; and
   a common node between the source-drain terminal of the p-channel transistor and the source-drain terminal of the n-channel transistor, wherein the five transistor pairs comprise first, second, third, fourth, and fifth transistor pairs, wherein the common node of the first transistor pair is coupled to one of the gates of the p-channel transistor and the n-channel transistor in each of the third, fourth, and fifth transistor pairs.

4. The memory element defined in claim 3 wherein the p-channel transistor and the n-channel transistor in each transistor pair of the five transistor pairs are connected together in series between a positive power supply line and a ground power supply line.

5. The memory element defined in claim 3 wherein the common node of each transistor pair of the five transistor pairs is coupled to at most one of the gates of the p-channel transistor and the n-channel transistor in any single other transistor pair of the five transistor pairs.

6. The memory element defined in claim 3, wherein the common node of the second transistor pair is coupled to another one of the gates of the p-channel transistor and the n-channel transistor in each of the third, fourth, and fifth transistor pairs.

7. The memory element defined in claim 6, wherein the common node of the third transistor pair is coupled to one of the gates of the p-channel transistor and the n-channel transistor in each of the first and second transistor pairs, wherein the common node of the fourth transistor pair is coupled to one of the gates of the p-channel transistor and the n-channel transistor in the first transistor pair, and wherein the common node of the fifth transistor pair is coupled to one of the gates of the p-channel transistor and the n-channel transistor in the second transistor pair.

8. A memory element comprising:
   at least first, second, third, fourth, and fifth transistor pairs each of which forms an inverter-type circuit and that collectively form a bistable cell, wherein each of the transistor pairs receives at least two distinct logic signal inputs; and a sixth transistor pair, wherein:
the first, second, third, fourth, fifth, and sixth transistor pairs are interconnected together to form the bistable cell;
each of the transistor pairs generates an output that is provided to two different transistor pairs in the bistable cell; and
each of the transistor pairs has a pair of distinct logic signal inputs and wherein each pair of the distinct logic signal inputs for the transistor pairs is unique.

9. The memory element defined in claim 8 wherein each inverter-type circuit comprises first and second transistors coupled together in series between first and second power supply terminals and respectively comprising first and second gate terminals that receive logically equivalent inputs.

10. The memory element defined in claim 9 wherein the first and second gate terminals in each inverter-type circuit receive respective inputs from different sources.

11. The memory element defined in claim 10 wherein the first and second transistors in each inverter-type circuit respectively comprise a p-channel transistor and an n-channel transistor.

* * * * *